US012663483B2

(12) United States Patent
Lesso et al.

(10) Patent No.: US 12,663,483 B2
(45) Date of Patent: Jun. 23, 2026

(54) CIRCUITRY FOR MEASUREMENT OF ELECTROCHEMICAL CELLS

(71) Applicant: Cirrus Logic International Semiconductor Ltd., Edinburgh (GB)

(72) Inventors: John P. Lesso, Edinburgh (GB); Claire Motion, Edinburgh (GB)

(73) Assignee: Cirrus Logic Inc., Austin, TX (US)

( * ) Notice: Subject to any disclaimer, the term of this patent is extended or adjusted under 35 U.S.C. 154(b) by 137 days.

(21) Appl. No.: 18/538,535

(22) Filed: Dec. 13, 2023

(65) Prior Publication Data

US 2025/0199083 A1 Jun. 19, 2025

(51) Int. Cl.
*G01R 31/392* (2019.01)
*G01K 3/00* (2006.01)
*G01R 31/389* (2019.01)
*G01R 31/396* (2019.01)

(52) U.S. Cl.
CPC ........... *G01R 31/392* (2019.01); *G01K 3/005* (2013.01); *G01R 31/389* (2019.01); *G01R 31/396* (2019.01)

(58) Field of Classification Search
None
See application file for complete search history.

(56) References Cited

U.S. PATENT DOCUMENTS

| | | | |
|---|---|---|---|
| 2003/0204328 A1 | 10/2003 | Tinnemeyer | |
| 2009/0212781 A1 | 8/2009 | Bertness et al. | |
| 2017/0003356 A1* | 1/2017 | Kaib | A61N 1/3708 |
| 2018/0294637 A1* | 10/2018 | Cass | G01K 7/22 |
| 2018/0306603 A1* | 10/2018 | Ballam | G01R 27/2605 |
| 2021/0048479 A1* | 2/2021 | Hyun | G01R 31/3646 |
| 2023/0011629 A1* | 1/2023 | Olson | G01R 31/3842 |
| 2023/0238884 A1* | 7/2023 | Kalfas | G01R 33/098 |
| | | | 307/31 |

FOREIGN PATENT DOCUMENTS

EP 3812780 B1 9/2022

OTHER PUBLICATIONS

Combined Search and Examination Report under Sections 17 and 18(3), UKIPO, Application No. GB2416485.7, mailed Apr. 23, 2025.
Search Report under Section 17, UKIPO, Application No. GB2514188.8, dated Sep. 30, 2025.

* cited by examiner

*Primary Examiner* — Jas A Sanghera
(74) *Attorney, Agent, or Firm* — Jackson Walker L.L.P.

(57) ABSTRACT
Circuitry for monitoring a characteristic of a battery cell integrated into a wearable device, the circuitry configured to: upon installation of the battery cell into the wearable device: obtaining a first signal from the battery cell; and upon activation of the wearable device after installation of the battery cell: obtain a second signal from the battery cell; and determine a characteristic of the battery cell based on the first signal and the second signal.

34 Claims, 7 Drawing Sheets

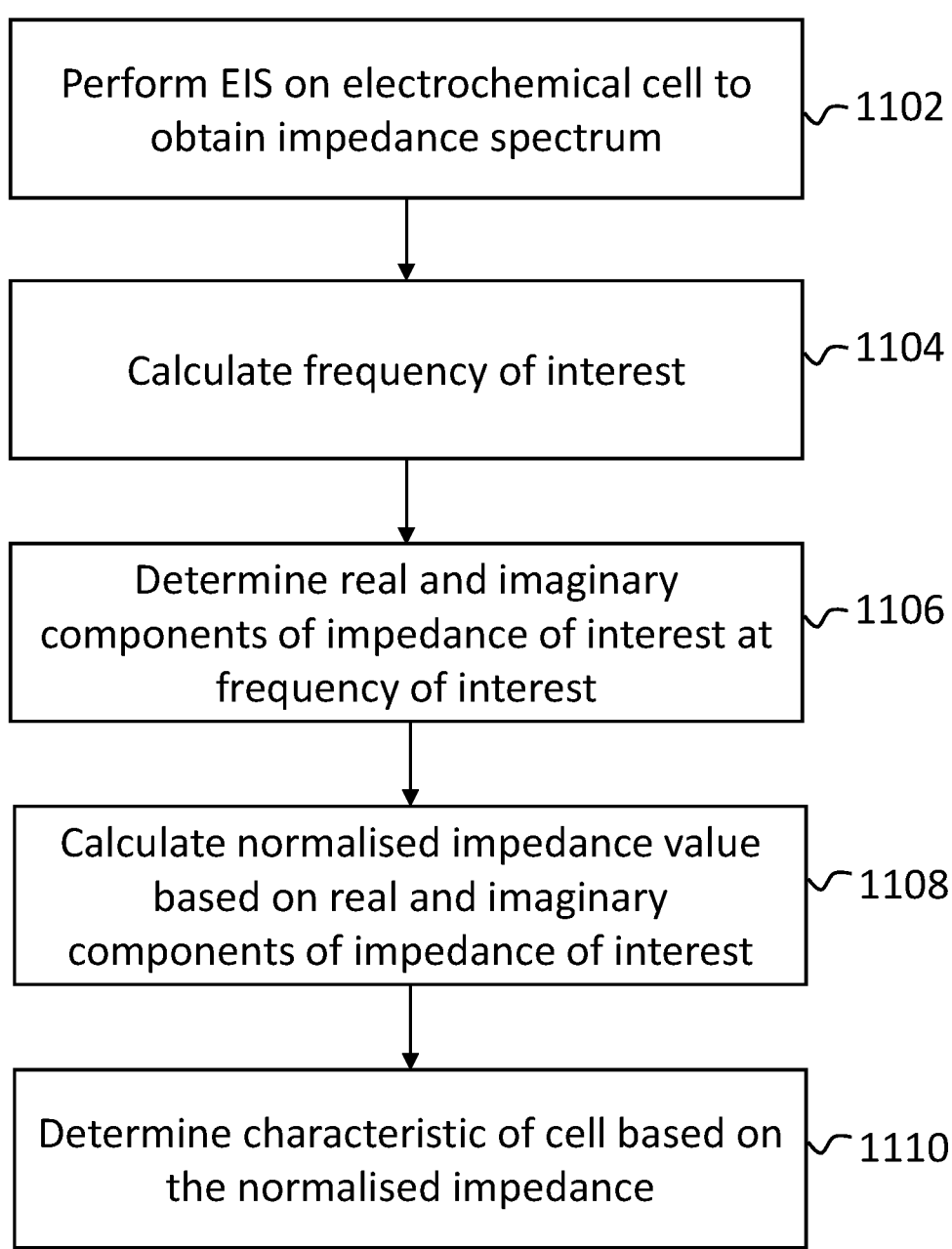

Perform EIS on electrochemical cell to
obtain impedance spectrum          1102

Calculate frequency of interest          1104

Determine real and imaginary
components of impedance of interest at
frequency of interest          1106

Calculate normalised impedance value
based on real and imaginary
components of impedance of interest          1108

Determine characteristic of cell based on
the normalised impedance          1110

Fig. 11

CIRCUITRY FOR MEASUREMENT OF ELECTROCHEMICAL CELLS

TECHNICAL FIELD

The present disclosure relates to circuitry for measuring characteristics in electrochemical cells.

BACKGROUND

Electrochemical cells are widely used in portable devices, in the form of a battery for providing power to a device, or in the form of a sensor for detecting one or more chemical species, analytes. The health of such electrochemical sensors is key to the operation of many devices into which they are integrated. As such, it may be advantageous to determine a state of such sensors during manufacture.

Electrochemical Impedance Spectroscopy (EIS) is one technique which can be used to obtain information about a characteristic or condition of an electrochemical cell. Such information can be used to identify a failure or deterioration of the cell and/or improve measurements taken with a sensor comprising the electrochemical cell.

SUMMARY

According to a first aspect of the disclosure, there is provided circuitry for monitoring a characteristic of an electrochemical cell integrated into a wearable device, the circuitry configured to: upon installation of the electrochemical cell into the wearable device: obtaining a first signal from the electrochemical cell; and upon activation of the wearable device after installation of the electrochemical cell: obtain a second signal from the electrochemical cell; and determine a characteristic of the electrochemical cell based on the first signal and the second signal.

The electrochemical cell may comprise an electrochemical sensor (e.g. potentiostatic or potentiometric sensor), or may comprise a battery cell (i.e. a power source). Whilst examples described herein refer to "an electrochemical cell", it will be appreciated that described solutions are applicable to the characterisation of multiple electrochemical cells, such as a plurality of battery cells making up a battery.

Activation of the wearable device may comprise powering up the wearable device. The wearable device may comprise a sensor for detecting removal of the wearable device from packaging, in which case activation of the wearable device may comprise removal of the wearable device from packaging so as to activate the sensor. Alternatively, the wearable device may be powered up by activating an RFID sensor (e.g. NFC) or the like on the wearable device.

The characteristic may comprise one of the following: a) a state of health; b) a state of charge; c) a power fade; d) a capacity fade; and e) ageing.

The circuitry may be configured to: determine a difference between the first signal and the second signal; and determine the characteristics of the electrochemical cell based on the difference.

The circuitry may be configured to: compare the difference to a difference threshold; and determine that the characteristic is outside of a standard operating condition of the cell if the difference is greater than a difference threshold.

The circuitry may be configured to: compare the first signal to a first criteria; compare the second signal to a second criteria; and flag that the characteristic is outside of an operating range if the first signal fails to satisfy the first criteria or the second signal fails to satisfy the second criteria.

The second criteria may be dependent on a time elapsed between the installation of the electrochemical cell and the activation of the wearable device.

The circuitry may comprise: a non-volatile memory, wherein the first and second signals are stored in the non-volatile memory.

The circuitry may comprise a real time clock, wherein the first and second signal are stored in the non-volatile memory with a time stamp generated using the real time clock.

Determining the characteristic may comprise determining a fault associated with the electrochemical cell.

Obtaining the first signal from the electrochemical cell may comprise applying a first stimulus to the electrochemical cell, wherein the first signal is responsive to the first stimulus. Obtaining the second signal from the electrochemical cell may comprise applying a second stimulus to the electrochemical cell, wherein the second signal is responsive to the second stimulus.

The first stimulus and/or the second stimulus may comprise a step signal or an impulse signal.

The first stimulus and/or the second stimulus may comprise a sine wave or a triangle wave or a chirp. A frequency of the sine wave or the triangle wave or the chirp may adjusted over a range of frequencies.

Determining the characteristic of the electrochemical cell based on the first response and the second response may comprise: determining, from the first signal, a first impedance of the electrochemical cell at a first frequency; determining, from the second signal, a second impedance of the electrochemical cell at the first frequency.

The first impedance may comprise a first real component and a first imaginary component. The second impedance may comprise a second real component and a second imaginary component. Determining the characteristic of the electrochemical cell based on the first signal and the second signal may comprise: normalising the first impedance to obtain a first dimensionless parameter based on the first real component and the first imaginary component; and normalising the second impedance to obtain a second dimensionless parameter based on the second real component and the second imaginary component.

The first dimensionless parameter may be defined by a ratio of the first real component or the first imaginary component to a sum or difference of the first real and imaginary components.

The second dimensionless parameter may be defined by a ratio of the second real component of the second imaginary component to a sum or difference of the second real and imaginary components.

The first dimensionless parameter and/or the second dimensionless parameter may be substantially independent of an area of an electrode of the electrochemical cell or a distance between two or more electrodes of the electrochemical cell.

Determining the characteristic of the electrochemical cell may comprise comparing the first dimensionless parameter to the second dimensionless parameter.

The first frequency may be selected to minimise a dependence of the first and second impedances on temperature.

The circuitry may be configured to: prior to obtaining the first signal: apply a broadband stimulus to the electrochemical cell; measure a broadband response of the electrochemical cell to the broadband stimulus over a frequency range; and determine the first frequency based on the measured broadband response. The broadband stimulus may have a frequency range spanning between approximately 0.1 Hz and 1 MHz.

The circuitry may further comprise a temperature sensor configured to monitor a temperature at the wearable device between the installation and the activation. The circuitry may be configured to output a temperature flag if the temperature falls outside of a safe operating range.

The circuitry may further comprise a comprises a real time clock. The real time clock may be configured to track a time between the installation and the activation.

The circuitry may be configured to output a time flag if the time between the installation and the activation exceeds a predetermined duration.

As noted above, the electrochemical cell comprises a battery cell. Alternatively, the electrochemical cell may comprise a potentiostatic sensor or a potentiometric sensor.

According to another aspect of the disclosure, there is provided circuitry for determining a state of health of an electrochemical cell integrated into a wearable device, the circuitry configured to: apply a first stimulus to the electrochemical cell; measure a first response of the electrochemical cell to the first stimulus at a first frequency; determine, from the first response, a first impedance of the electrochemical cell at a first frequency, the first impedance comprising a first real component and a first imaginary component; and normalise the first impedance to obtain a first dimensionless parameter based on the first real component and the first imaginary component; and determine the state of health based on the first dimensionless parameter.

The circuitry may be further configured to: apply a second stimulus to the electrochemical cell after application of the first stimulus; measure a second response of the electrochemical cell to the second stimulus at the first frequency; determine, from the second response, a second impedance of the electrochemical cell at a first frequency, the first impedance comprising a second real component and a second imaginary component; normalise the second impedance to obtain a second dimensionless parameter based on the second real component and the second imaginary component; and determine the state of health based on the second dimensionless parameter.

Determining the state of health may comprise comparing the first dimensionless parameter to the second dimensionless parameter.

The first stimulus may be applied to the electrochemical cell upon installation of the electrochemical cell into the wearable device. The second stimulus may be applied to the electrochemical cell upon first activation of the wearable device after integration of the electrochemical cell.

According to another aspect of the disclosure, there is provided an integrated circuit (IC), comprising the circuitry described above.

According to another aspect of the disclosure, there is provided a wearable device, comprising: circuitry described above and the electrochemical cell.

The wearable device comprises one of an analyte monitor, a glucose monitor, a battery monitor, a mobile computing device, a smart watch, a remote control device, a home automation controller, an audio player, a video player, a mobile telephone, and a smartphone.

According to another aspect of the disclosure, there is provided a system, comprising: circuitry described above; and the electrochemical cell.

Throughout this specification the word "comprise", or variations such as "comprises" or "comprising", will be understood to imply the inclusion of a stated element, integer or step, or group of elements, integers or steps, but not the exclusion of any other element, integer or step, or group of elements, integers or steps.

BRIEF DESCRIPTION OF DRAWINGS

Embodiments of the present disclosure will now be described by way of non-limiting examples with reference to the drawings, in which:

FIG. 11 is a flow diagram of a process for calculating a normalised impedance of an electrochemical cell according to embodiments of the present disclosure.

DESCRIPTION OF EMBODIMENTS

Electrochemical sensors are widely used for the detection of one or more particular chemical species, analytes, as an oxidation or reduction current. Such sensors comprise an electrochemical cell, consisting of two or more electrodes configured for contact with an analyte whose concentration is to be ascertained. Such sensors also comprise circuitry for driving one or more of the electrodes and for measuring a response at one or more of the electrodes. Batteries also comprise one or more electrochemical cells which typically consist of two or more electrodes (e.g., an anode and a cathode) configured for contact with a conductive electrolyte. Characteristics of batteries may be ascertained using drive and measurement circuitry similar to that used for characterising electrochemical cells in electrochemical sensors.

Embodiments of the present disclosure provide various novel signal processing techniques for the determination of characteristics associated with electrochemical cells and systems (such as sensors, batteries and the like) into which electrochemical cells are incorporated. Embodiments also provide novel health monitoring techniques, which may be used during manufacture and deployment of devices integrated with electrochemical cells, for the purpose of detecting faults or potential issues with operation of the electrochemical cells and/or devices.

Various implementation details pertaining to drive and measurement circuitry for obtaining characterising impedance measurements of an electrochemical cell are described below. Such embodiments focus primarily on electrochemical cells comprised in sensors (e.g. potentiostats). For example, the embodiments described herein may be implemented as part of an analyte monitoring system, such as a continuous glucose monitor (CGM). It will be appreciated, however, that embodiments are not limited to use with electrochemical sensors. For example, batteries also comprise one or more electrochemical cells which typically consist of two or more electrodes (e.g., an anode and a cathode) configured for contact with a conductive electrolyte. Impedance characteristics of batteries (e.g. comprising lithium ion or silver oxide cell(s)) may be ascertained using drive and measurement circuitry described herein. For example, embodiments of the present disclosure may be implemented as part of a battery monitoring device (e.g. to monitor the status and/or health of a battery).

Figure 1:
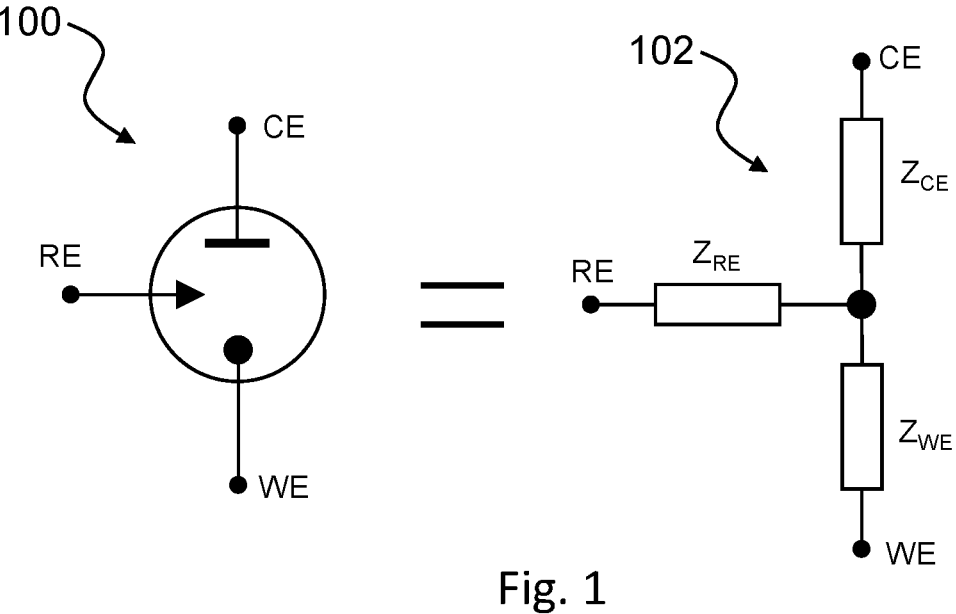
FIG. 1 illustrates a schematic diagram and electrical equivalent circuit for a three-electrode electrochemical cell.

FIG. 1 is a schematic diagram of an example electrochemical cell 100 comprising three electrodes, namely a counter electrode CE, a working electrode WE and a reference electrode RE. FIG. 1 also shows an equivalent circuit 102 for the electrochemical cell 100 comprising a counter electrode impedance ZCE, a working electrode impedance ZWE and a reference electrode impedance ZRE.

Figure 2:
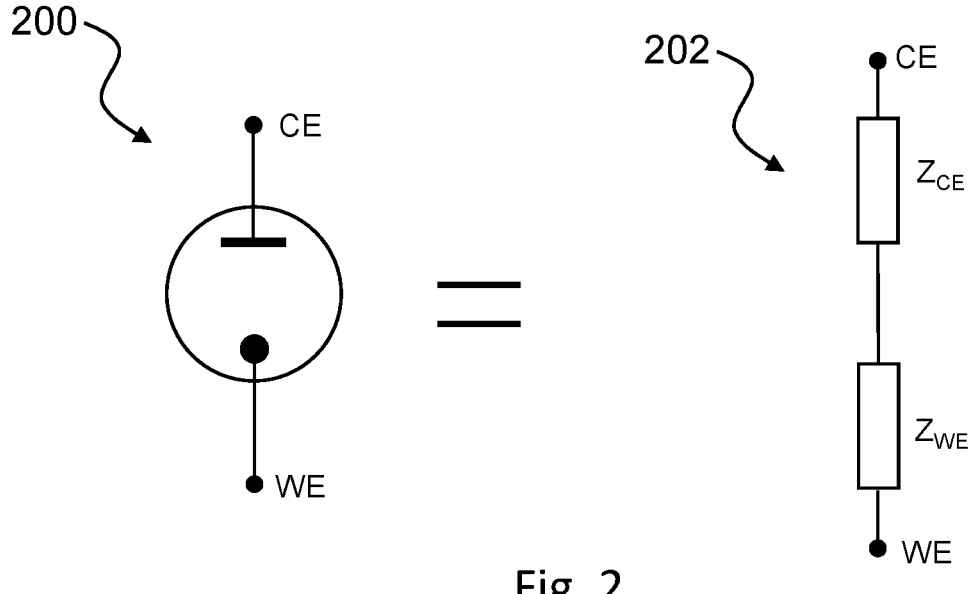
FIG. 2 illustrates a schematic diagram and electrical equivalent circuit for a two-electrode electrochemical cell.

FIG. 2 is a schematic diagram of another example electrochemical cell 200 comprising two electrodes, namely a counter electrode CE and a working electrode WE. The electrochemical cell 200 varies for the cell 100 with the omission of the reference electrode RE. FIG. 2 also shows an equivalent circuit 102 for the electrochemical cell 200 comprising a counter electrode impedance ZCE and a working electrode impedance ZWE.

In some embodiments, the working electrode WE comprises an assay or chemical of interest. For example for the analysis of glucose as an analyte, the working electrode may comprise a layer of glucose oxidase. The counter electrode CE is provided to form an electrical or ohmic connection with the working electrode WE. Optionally, the reference electrode is provided, which is typically a sensing point between the working electrode WE and the counter electrode CE, allowing independent measurement of the potential associated with each of the working and counter electrodes WE. CE, rather than just measuring a potential difference between the counter and working electrodes CE, WE.

Embodiments of the disclosure will be described with reference to these example electrochemical cells 100, 200. It will be appreciated, however, that the techniques and apparatus described herein may be used in conjunction with any conceivable electrochemical system, including but not limited to electrochemical cells comprising at least two electrodes (e.g. a counter electrode CE, a working electrode WE and optionally a reference electrode RE), or electrochemical cells with more than three electrodes (e.g. two or more counter electrodes and/or two or more working electrodes). Electrodes of the electrochemical cells described herein may also be referred to as anodes and/or cathodes as is conventional in the field of electrical batteries.

To determine a characteristic of either of the electrochemical cells 100, 200, and therefore an analyte concentration, it is conventional to apply a bias voltage at the counter electrode CE and measure a current at the working electrode WE. When provided, the reference electrode RE may be used to measure a voltage drop between the working electrode WE and the reference electrode RE. The bias voltage is then adjusted to maintain the voltage drop between the reference and working electrodes RE, WE constant. As the resistance in the cell 100 increases, the current measured at the working electrode WE decreases. Likewise, as the resistance in the cell 100 decreases, the current measured at the working electrode WE increases.

Thus the electrochemical cell 100 reaches a state of equilibrium where the voltage drop between the reference electrode RE and the working electrode WE is maintained constant. Since the bias voltage at the counter electrode CE and the measured current at WE are known, the resistance of the cell 100 can be ascertained.

Figure 3A:
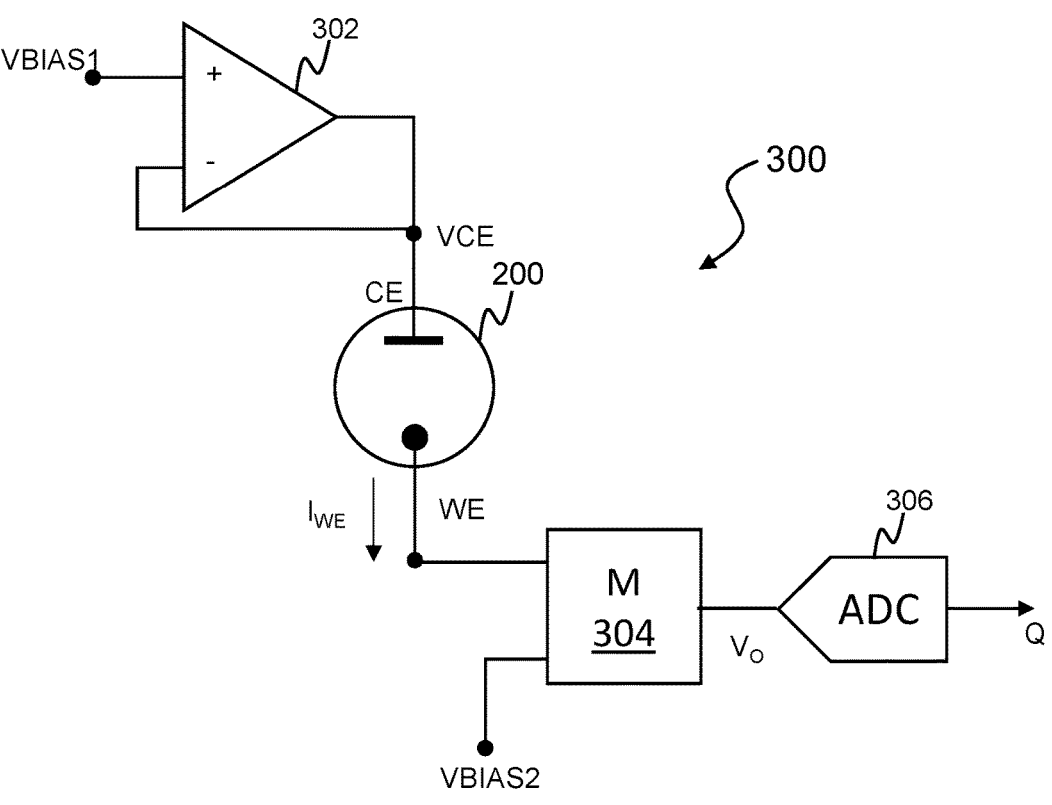
FIG. 3A is a schematic diagram of an example prior art measurement circuit.

FIG. 3A illustrates an example prior art drive and measurement circuit 300 which is configured to implement the above explained cell characterisation, specifically for measuring an analyte concentration in the electrochemical cell 200 shown in FIG. 2. The circuit 300 comprises a first amplifier 302 and a measurement circuit 304. Each of the first amplifier 302 and the measurement circuit 304 may comprise one or more op-amps. A non-inverting input of the first amplifier 302 is coupled to a bias voltage VBIAS which may be generated by a digital-to-analog converter DAC (not shown). An inverting input of the first amplifier 302 is coupled to the counter electrode CE. An output of the first amplifier 302 is coupled to the counter electrode CE and configured to drive the counter electrode CE with a counter electrode bias voltage VCE. The counter electrode bias voltage VCE applied at the counter electrode CE by the first amplifier 202 is proportional to the difference between the bias voltage VBIAS1 and the voltage at the counter electrode CE.

The measurement circuit 304 is coupled between the working electrode WE and an analog-to-digital converter (ADC) 306. The measurement circuit 304 is operable to output to the ADC 306 a signal proportional to the current flowing from the working electrode WE. The ADC 306 then converts the signal output from the measurement circuit 304 to a digital output signal Q which represents the current flowing from the working electrode WE.

The measurement circuit 304 is typically implemented as a transimpedance amplifier or a current conveyor.

Figure 3B:
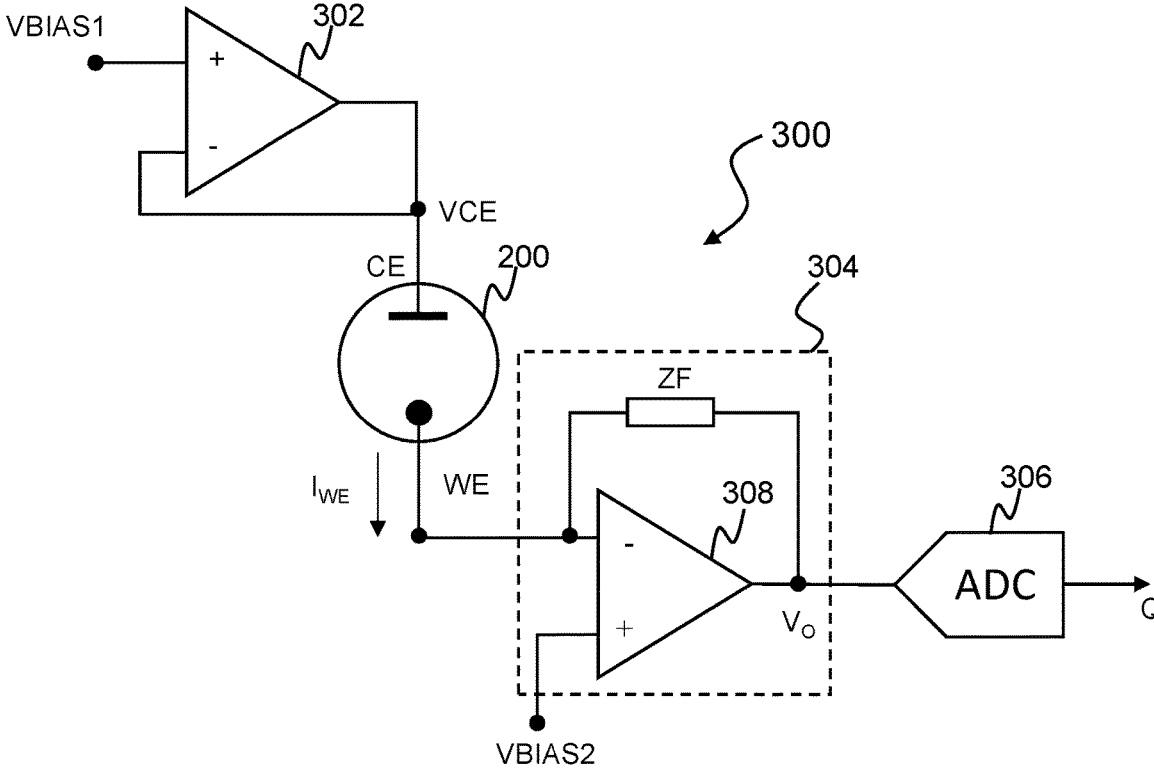
FIG. 3B is a schematic diagram of the circuit of FIG. 3A, showing the measurement circuitry in more detail.

FIG. 3B illustrates an example implementation of the drive and measurement circuit 300, the measurement circuit 304 implemented as a transimpedance amplifier comprising a second amplifier 308. An inverting input of the second amplifier 308 is coupled to the working electrode WE and a non-inverting input of the second amplifier 308 is coupled to a fixed bias voltage VBIAS2, for example ground GND. A feedback impedance ZF is coupled between the non-inverting input and an output of the second amplifier 308. As such, the second amplifier 308 operates as a transimpedance amplifier. The second amplifier 308 is thus operable to output a voltage VO which is proportional to the current IWE at the working electrode WE. The output voltage VO is then provided to the analog-to-digital converter (ADC) 306 which outputs a digital output Q which represents the current IWE at the working electrode WE.

To bias the counter electrode CE, and therefore the electrochemical cell 200, at different voltages, the bias voltage VBIAS1 provided to the first amplifier 302 may be adjusted. The bias voltage VBIAS1 may be adjusted between a reference voltage (e.g. ground or zero volts) and the supply voltage VDD. With the non-inverting input of the second amplifier 204 is set at VDD/2, a positive bias may be applied to the cell 200 by maintaining the bias voltage VBIAS above VDD/2. Likewise, a negative bias may be applied to the cell 100 by maintaining the bias voltage VBIAS below VDD/2.

The drive and measurement circuitry 200 described above may be used to implement electro-impedance spectroscopy (EIS) on the cell 100.

To implement EIS, it is conventional to modulate the bias voltage VBIAS1, for example by applying a sine wave having a modulated frequency and/or amplitude. The measurement circuit 304 and ADC 306 may then be used to measure a response of the cell 200 to that sine wave, in the form of the output voltage VO. The frequency of the sine wave may be adjusted over a range of frequencies in order to obtain a series of frequency dependent impedance measurements of the cell 200. Alternatively, one or more frequencies of interest may be known (identified, estimated, modelled or otherwise predetermined) such that the sine wave which is applied is at that frequency of interest. Each frequency of interest may be chosen to minimize variation in measurements or maximise a response of the cell for determining a particular characteristic.

An alternative known approach to the above EIS technique is chronoamperometry (CA) in which a step or impulse function stimulus is applied to the cell 200. A transfer function between the stimulus and a response of the cell 200 to that stimulus can then be estimated or inferred.

In some embodiments, the cells 100, 200 may be potentiometric as opposed to potentiostatic. In such cases, the working electrode WE may comprise an ion-selective membrane 104, which may be configured to uptake only a specific ion (in this case the cation, I+) from an electrolyte solution 106. As such, the potential difference between the working electrode WE and the reference electrode RE will depend on the concentration of that particular ion analyte in the electrolyte solution 106. Thus, the potential difference across the cells 100, 200 may be measured to ascertain ion analyte concentration. A typical approach to such measurement is to couple each of the working and reference electrodes WE, RE to high input impedance buffers which are used, in turn, to drive one or more ADCs (e.g. two single ended ADCs or one differential ADC). A digital output signal is then derived which represents the potential difference between working and reference electrode WE, RE of the cell 100.

In the above examples described with reference to FIGS. 3A and 3B, drive circuitry is provided to apply a stimulus to the cell 200. Where the cell 200 is implemented as a power source or a potentiometric sensor, it may not be necessary to apply a stimulus to induce a response from the cell 200.

Figure 4:
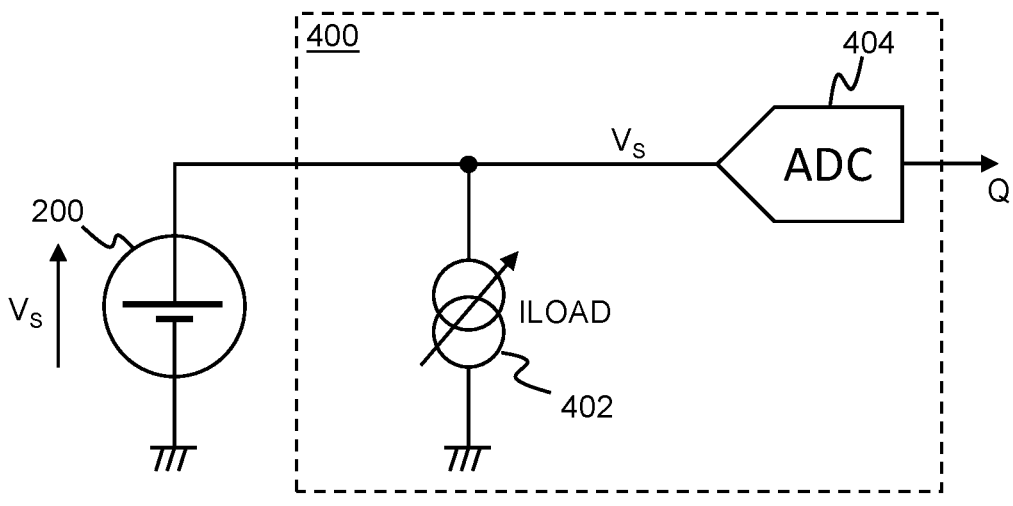
FIG. 4 is a schematic diagram of an example measurement circuit.

FIG. 4 illustrates an example measurement circuit 400 for characterisation of the cell 200 implemented as a battery (i.e. as a power source). The circuit 400 comprises a variable current source 402 and an ADC 404. The cell 200 is coupled between a reference voltage (in this case ground) and an input of the ADC 404. The current source 402 is also coupled between a reference voltage (again ground in this example) and the input of the ADC 404. To characterise the cell, the current source 402 is configured to draw a load current ILOAD from the cell 200 during a test period, which induces a measurable potential difference Vs across the cell 200. This voltage Vs is converted by the ADC 404 to a digital signal Q representing the voltage across the cell 200, which can be used to determine a characteristic of cell 200.

As noted, above, the cells 100, 200 and circuits 300, 400 are often integrated into electronic devices to be utilised for a particular practical application, such as sensing or providing power.

Figure 5:
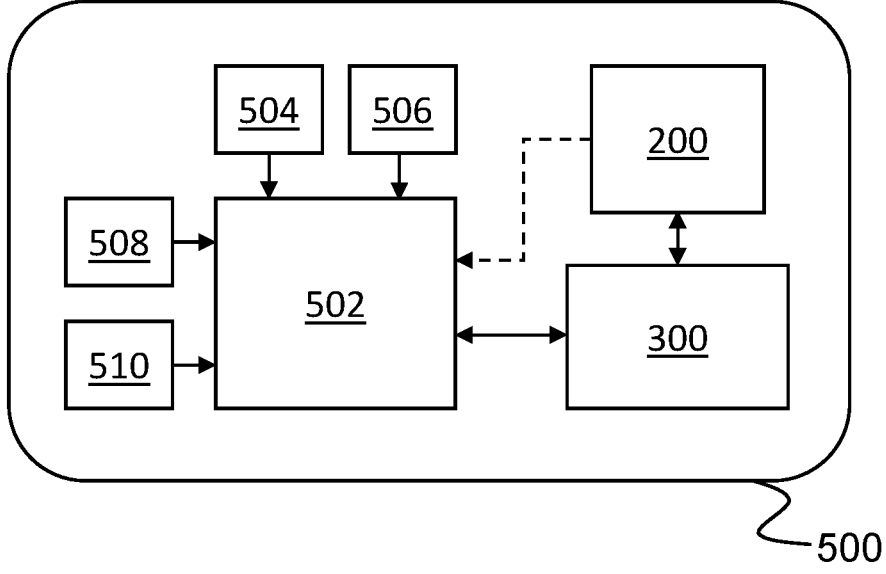
FIG. 5 is a block diagram of an electronic device according to embodiments of the present disclosure.

FIG. 5 illustrates an example electronic device 500 comprising the electrochemical cell 200 according to embodiments of the present disclosure. The example shown in FIG. 5 is provided for explanatory purposes only and may comprise one or more additional components or fewer components depending on the specific application of the electronic device 500. In the example in FIG. 5, the device 500 comprises the drive and measurement circuit 300 of FIG. 3.

It will be appreciated that the circuit 300 may be replaced with the measurement circuit 400 of FIG. 4 without departing from the scope of the present disclosure. Both circuits 300, 400 generate a digital output Q which is representative of a characteristic of the cell 200.

In the example shown, the electronic device 500 comprises a processor 502 which may be configured to control the drive and measurement circuit 300 and process signals received from the drive and measurement circuit 300. The processor 502 may be an applications processor AP, a digital signal processor (DSP). The processor may be formed of a single processor or multiple processors. For example the electronic device 500 may comprise an AP and a DSP.

The device 500 may further comprise a memory 504, which may in practice be provided as a single component or as multiple components. The memory 504 may be provided for storing data and/or program instructions. The memory 504 may comprise non-volatile memory. The memory 504 may additionally or alternatively comprise volatile memory.

The device 500 may further comprise a transceiver 506, which may be provided to communicate (wired or wirelessly) with external devices, such as a host device (e.g. mobile device or smartphone) or a remote device (e.g. via the internet).

The device 500 may further comprise a temperature sensor 508 and may comprise other sensors (not shown).

The device 500 may further comprise a real time clock (RTC) 510 which may be used to timestamp data obtained from the cell 200 or data derived from data obtained from the cell 200, which may be stored in the memory 504.

The device 500 may further comprise an external or internal power source (such as a battery). It will be appreciated that where the cell 200 is a battery, the cell 200 may provide power to the device 500 as denoted by the dotted line between the cell 200 and the processor 502.

Non-limited examples of the electronic device 500 include an analyte monitoring device or an analyte sensing device, a continuous glucose monitor, a battery, a battery monitoring device, a mobile computing device, a laptop computer, a tablet computer, a games console, a remote control device, a home automation controller or a domestic appliance, a toy, a robot, an audio player, a video player, or a mobile telephone, and a smartphone.

It will be appreciated that ageing of electrochemical cells occurs from the time of their initial manufacture. There are many different ageing mechanisms which may affect a cell, such as loss of active material, active material dissolution, surface cracking, pore clogging, solid electrolyte interphase (SEI) kinetics, diffusion into SEI, and electron tunnelling to name a few. In battery cells, these mechanisms can lead to capacity fade, power fade, and reduced charge. In electrochemical sensors, these mechanisms can lead to changes in electrode area, impedance characteristics, and ion selective potential difference values. Whilst many variables can affect the speed of ageing of a cell (e.g. mechanical stresses, current load, and stoichiometry), two significant variables include time and temperature.

With this in mind, it will be appreciated that in many instances, there will be a time lag between manufacture of the electrochemical cell 200, manufacture of drive and measurement circuit 300 (if provided), integration of the electrochemical cell 200 and circuit 300 into the electronic device 500, and activation of the electronic device 500 by an end user. It will also be appreciated that manufactured of the various parts of the electronic device 500 (including the device 500 itself) may very likely be performed in different locations and/or by different entities. For example, the electrochemical cell 200 may be manufactured by a first entity at a first location, the drive and measurement circuit 300 by a second entity at a second location, and the electronic device 500 may be manufactured by a third entity at a third location. In view of this, component parts of the electronic device 500 may have been transported many miles (in some cases between continents) and may therefore be subject to large temperature variations on their journey to final assembly. And after assembly, consignments of the electronic device 500 may again be shipped many miles to an end user, providing another opportunity for adverse transport and storage conditions.

It will therefore be appreciated that the state of the electrochemical cell 200 (e.g. the ageing of that cell) will change over time from completion of its manufacture to its integration into the electronic device 500 to activation of the electronic device 500 by a end user. Moreover, since the journey of the cell 200 to the end user is unknown, the state of the electrochemical cell 200 at the point of activation of the device 500 by the end user is also unknown.

As noted above, changes in the state of the cell 200 may adversely affect the functioning of the cell 200 and thus the electronic device 500 into which is integrated. Changes in the state of the cell 200 may detrimentally affect functionality to such an extent that precludes its operation or means that it functions outside of its required or specified operation limits. For example, by the time the cell 200 reaches the production line to be integrated into an electronic device 500, the cell 200 may have aged to an extent that it is no longer fit for purpose, such that the cell 200 must be discarded. Such ageing may be due to many factors, most notably time and temperature variation. Moreover, even if the cell 200 is fit for purpose at the time of integration into the device 500, if the device 500 sits inactive (e.g. in storage) for an extended period before being deployed by a final user, the state of the cell 200 at the time of activation of the device 500 may have deteriorated to an extent that the device 500 fails to function at minimum operating requirements.

Embodiments of the present disclosure aim to address or at least ameliorate one or more of the above issues by providing circuitry and methods for monitoring the state of an electrochemical cell at multiple times during its lifecycle. For example, from manufacture of the cell to integration into a device to activation to deployment to a final user. Circuitry is provided for monitoring a state of health of an electrochemical cell, which may be provided with the cell 200 or provided in the device 500 into which the cell is integrated. In doing so, a state and/or degree of deterioration of the cell 200 may be ascertained and steps taken to ensure any device reaching an end user is functioning as intended by the manufacturer.

Embodiments of the present disclosure also provide techniques to normalise measurements taken from electrochemical cells to account for their cell ageing. Such techniques enable signals to be obtained from electrochemical cells which are less sensitive to such ageing, thus enabling cells and devices into which they are incorporated to be used for longer periods of time and despite exposure to other adverse conditions such as temperature and mechanical stress.

In examples described below, the circuitry for monitoring a state of health of the electrochemical cell 200 is implemented using existing elements of the device 500 into which the cell 200 is implemented (i.e. the processor 502, memory 504, transceiver 506 and drive and measurement circuit 300). In alternative embodiments, such circuitry may be provided at least partially separate from the device 500. For example, one or more functions of such circuitry may be provided by a host device (not shown) which may be in communication with the device 500.

Figure 6:
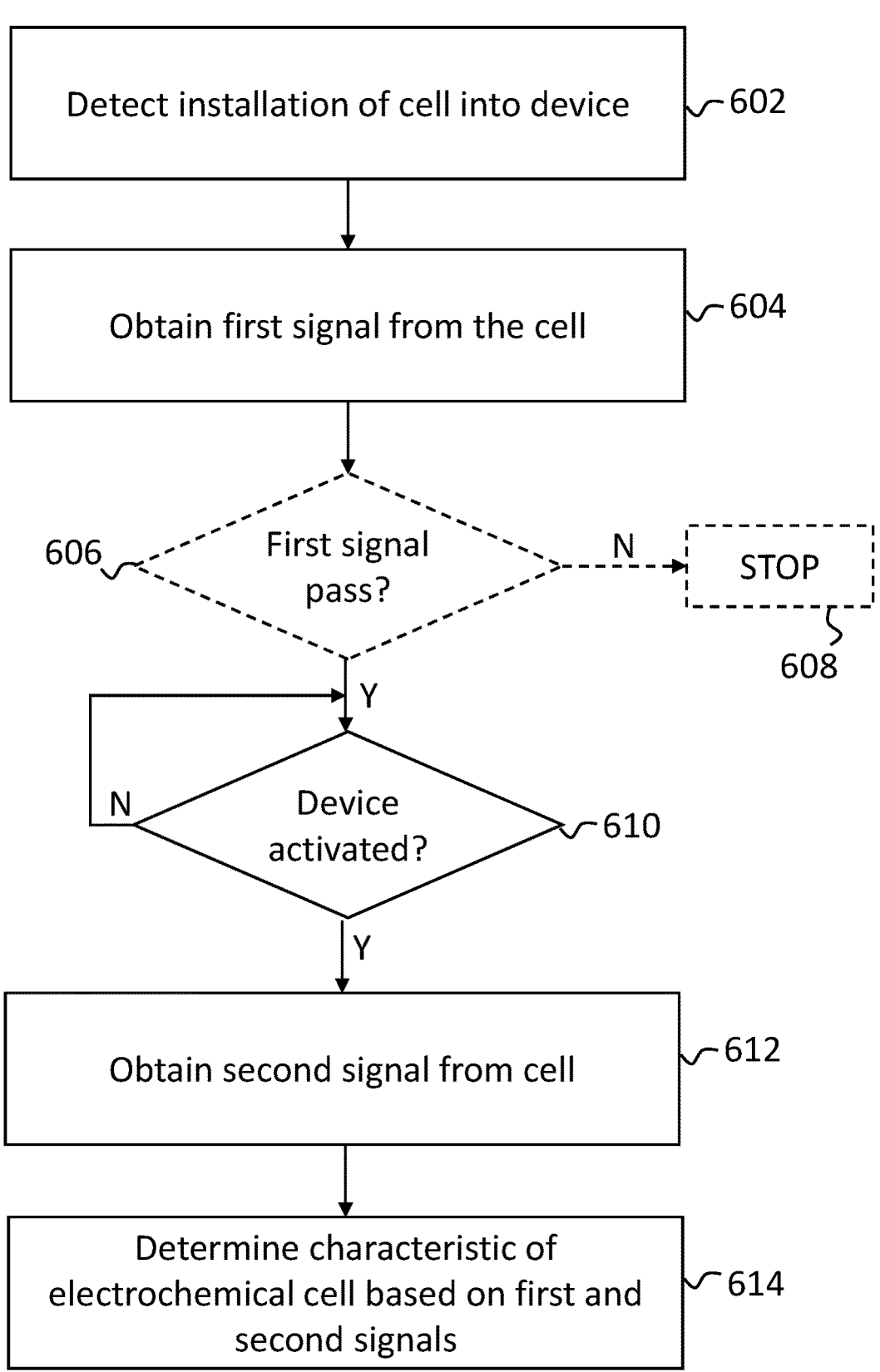
FIG. 6 is a flow diagram of a process which may be implemented by the device of FIG. 5.

FIG. 6 is a block diagram of an example process 600 which may be implemented by the device 500 shown in FIG. 5 for monitoring a state of the electrochemical cell 200.

At step 602, a determination is made that the electrochemical cell 200 has been installed in the device 500. This step may be performed, for example, on a test bed at a manufacturing facility or otherwise during manufacture of the device 500. In some embodiments, step 602 may be inferred. For example, upon completion of manufacture of the device 500, it may be inferred that the cell 200 is installed within the device 500. As such, in some embodiments, this step of determining that the cell 200 is installed in the device 500 may be omitted.

At step 604, at or soon after installation of the cell 200 or at some period of time after manufacture of the device 500, the cell 200 may undergo a testing phase in which a signal may be obtained from the cell 200 in a manner such as those described above. For example, a first stimulus may be applied to the cell 200 (e.g. by the drive and measurement circuit 300) and a first response of the cell 200 to the first stimulus may be measured (step 604). Alternatively, a potential difference across the cell 200 may be measured in the presence of some known analyte. Where a stimulus is applied, the stimulus may be an EIS stimulus, or an alternating stimulus (e.g. sine wave) at a predetermined frequency. Additionally or alternatively, the stimulus may be a CA stimulus or the like. In performing step 604, a signal may be obtained which can be used to determine one or more characteristics of the cell such as but not limited to an impedance of the cell. The first signal obtained from the cell 200 may be stored in memory 504. Any data obtained during step 604 may be timestamped using time information from the RTC 510.

Optionally at step 606, the first signal, which corresponds to one or more characteristics of the cell 200, may be analysed to determine whether a state of the cell 200 satisfies one or more criteria. The one or more characteristics may comprise one or more of a state of charge, a state of health, a capacity, and a fade. This health check may provide an output, i.e. a pass or fail which may denote whether the cell 200 can be used for a particular application or used for any application. For example, if the cell 200 is a non-chargeable battery cell and one or more of a state of charge, a capacity and a power of the cell is below a respective threshold level, the cell 200 may fail the test at step 606. Optionally, the signal may undergo multiple tests for different cell characteristics and the outcome of these tests combined to obtain an overall health score which may be compared to one or more thresholds to determine whether to pass or fail the cell 200. In some embodiments, multiple thresholds may be provided, each pertaining to a different application or level of accuracy. The first signal, any data obtained from the processing/analysis at step 606, and/or the outcome(s) of the tests at step 606 may be stored in the memory 504 for future reference, as discussed in more detail below.

If, at step 606, the cell 200 fails, the process 600 may stop. A decision may then be made as to how to proceed. For example, a decision may be made to discard the device 500 (step 608). Alternatively, a decision may be made to replace the cell 200 in the device 500 with another cell. Additionally or alternatively, a decision may be made to limit use of the device 500 to particular applications depending on which characteristics meet or fall below acceptable thresholds of performance. Additionally, or alternatively, if multiple devices are being manufactured, the failure of one cell 200 may instigate the write-off of all cells (or devices integrating such cells) from the same batch as the cell 200.

If at step 606 the cell 200 passes the one or more tests, e.g. the state of the cell 200 is considered acceptable for the particular application in the device 500, the process 600 continues to step 610 in which activation of the device 500 is monitored. Activation may comprise startup or power up of the device by a final user. Additionally or alternatively, the device 500 may be activated by removal from packaging (not shown). For example, the device 500 may comprise a sensor (not shown) configured to determine when the device 500 has been removed from packaging. If the device 500 has not been activated, the process 600 continues to repeat step 610 periodically to ascertain whether the device 500 has been activated.

During the period between first testing the cell 200 and activation of the device 500, the device 500 may be configured to obtain temperature measurements using the temperature sensor 508, which may be stored in the memory 504. In doing so, historical temperature data for the device 500 and the cell 200 integrated therein can be later analysed to determine or estimate ageing of the device due to thermal stress. The temperature data obtained from the temperature sensor 508 may be timestamped with aid of the real time clock 510.

Upon activation of the device 500, the process 600 proceeds to step 612. At step 612, a similar step to that which is taken at step 604 takes place. That is, the cell 200 may undergo a second testing phase in which a second signal may be obtained from the cell 200 in any conceivable manner, such as those described above. For example, a second stimulus (which may be the same or different to the first stimulus) may be applied to the cell 200 (e.g. by the drive and measurement circuit 300) and a second response of the cell 200 to the second stimulus may be measured (step 604). Alternatively, a potential difference across the cell 200 may be measured in the presence of some known analyte, that potential difference being the second signal used for analysis of the cell 200. Where a stimulus is applied, the stimulus may be an EIS stimulus, or an oscillating waveform (e.g. sine wave) having a predetermined frequency. Additionally or alternatively, the stimulus may be a CA stimulus or the like. In performing step 612, a signal may be obtained which can be used to determine one or more characteristics of the cell such as but not limited to an impedance of the cell. Since information pertaining to the tests at step 604 is stored in memory, data obtained from the second testing phase may be used in combination with that of the first testing phase to determine a degree of ageing of the cell 200. Any data obtained during step 612 may be timestamped with aid of the RTC 510.

Thus, at step 614, one or more characteristics of the cell 200 may be determined based on the first signal obtained during the first testing step 604 and the second signal obtained during the second testing step 612. In some embodiments, a difference between the first and second signals may be calculated. Additionally, or alternatively, an impedance of the cell 200 may be calculated based on each of the first and second signals and respective first and second impedances may be compared to obtain an impedance difference. The difference may be compared to a threshold to determine a degree of ageing of the cell 200. Additionally or alternatively, timestamped temperature data obtained prior to activation of the device 500 may be used to determine one or more characteristics of the cell 200. For example, if the temperature of the device 500 has exceeded an upper temperature threshold, a determination may be made that the cell 200 is faulty due to the likelihood that exposure to such temperatures would cause a fault in or significant deterioration of performance of the cell 200.

It will be understood that electrode area in electrochemical cells (as well as distance between electrodes) is subject to change over time, for example due to wetting and/or ageing of the electrode. It will also be appreciated that measured impedance is dependent on electrode area. Accordingly, the change in effective area of electrodes of an electrochemical cell over time due to cell ageing can make impedance measurement repeatability challenging. To understand why this is the case, it is useful to consider Nyquist plots for the electrochemical cell 200 (or the equivalent circuit) having two different working electrode areas.

Figure 7:
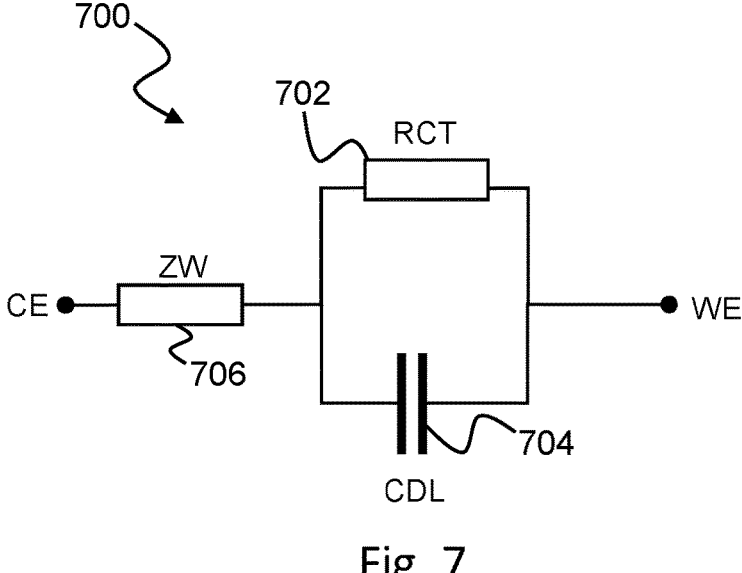
FIG. 7 is a circuit diagram of a Randles equivalent circuit.

FIG. 7 shows a schematic diagram of a Randles circuit 700. The Randles circuit comprises a resistor 702 having charge transfer resistance RCT, a load capacitor 704 having a double layer capacitance CDL, and a series Warburg impedance 706 with impedance ZW. The charge transfer resistor 702 is provided in parallel with a load capacitor 704. The series impedance 706 is provided in series with the parallel combination of the resistor 702 and the load capacitor 704.

Figure 8:
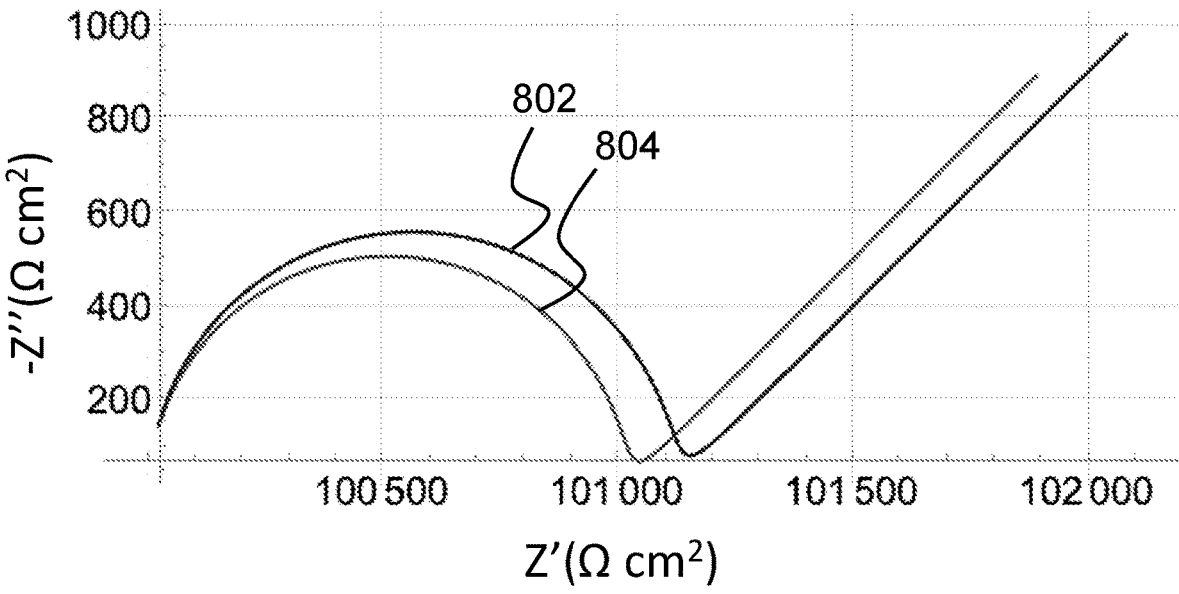
FIG. 8 is a Nyquist plot of two impedance spectrums for an electrochemical cell.

FIG. 8 graphically illustrates a first Nyquist plot 802 of real vs imaginary impedances Z', Z" for the Randles circuit 700 with an electrode area A, and a second Nyquist plot 804 for the Randles circuit 700 with an electrode area 1.1*A (i.e. 10% larger than A). It can be seen that the first Nyquist plot 802 differs from the second Nyquist plot 804, illustrating the dependence of impedance ZW on electrode area.

Embodiments of the present disclosure aim to address or at least ameliorate one or more of the above issues. Specifically, to substantially eliminate or reduce the effect of electrode area variation on impedance measurements, embodiments of the present disclosure utilise a normalised dimensionless parameter, Γ.

Figure 9:
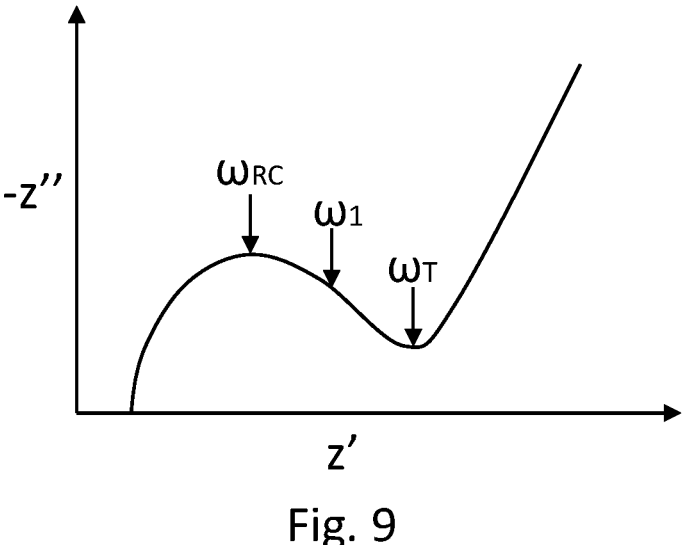
FIG. 9 graphically illustrates a typical Nyquist plot for an electrochemical cell.

Methods of extracting information (such as characteristics of electrochemical cells) using EIS will now be described with reference to FIGS. 9 to 11.

To characterise the cell 200, EIS may be performed on the cell 200 across a full frequency spectrum, for example between 0.1 and 20 kHz. In doing so, a full Nyquist curve may be obtained for the cell 200, from which the RC crest and the turning point at which the low frequency Warburg line meets the RC part of the Nyquist curve meet. FIG. 9 shows a generic example Nyquist plot 900 for the cell 200 illustrating respectively, the RC frequency $\omega_{RC}$, the turning point frequency $\omega_r$ and the frequency of interest $\omega_1$ being a frequency between the RC and turning point frequencies $\omega_{RC}$, $\omega_T$.

The frequency ω1 may be calculated from the EIS spectrum using the following equation:

$$\omega_1 = \alpha\omega_{RC} + (1-\alpha)\omega_T$$

The value of alpha which affects the frequency of interest $\omega_1$ in the above equation may vary between 0.25 and 0.75, for example around 0.25, or around 0.5, or around 0.75. The frequency of interest $\omega_1$ may be selected to minimize the effect of temperature on the measurement of impedance. Additionally, or alternatively, the frequency of interest $\omega_1$ may be selected to maximise discrimination between values of a chosen metric, such as state of charge, state of health, capacity fade, etc. In some embodiments, a chosen metric may be derived from a projection of a series of frequencies of interest. Such projection may be derived using any conceivable methodology, including but not limited to principal component analysis (PCA), singular value decomposition (SVD), etc.

The impedance Z can be defined in terms of its imaginary and real parts as follows:

$$Z = Z' + iZ''$$

As such, the dimensionless parameter $\Gamma$ representing the normalised impedance can be defined in terms of these imaginary and real parts, as follows:

$$\Gamma = \frac{Z'(\omega_1)}{Z'(\omega_1) - Z''(\omega_1)}$$

This dimensionless parameter is substantially robust to changes in electrode area (for example due to wetting and/or ageing of the cell) as well as being substantially immune to temperature effects.

By considering the Kramers-Kronig relationships for the cell 200, for example, it can be shown that:

$$Z'(\omega_1) = H(Z''(\omega_1))$$
$$Z''(\omega_1) = -H(Z'(\omega_1))$$

Hence for any causal system the terms Z' and Z" will have different signs.

Figure 10:
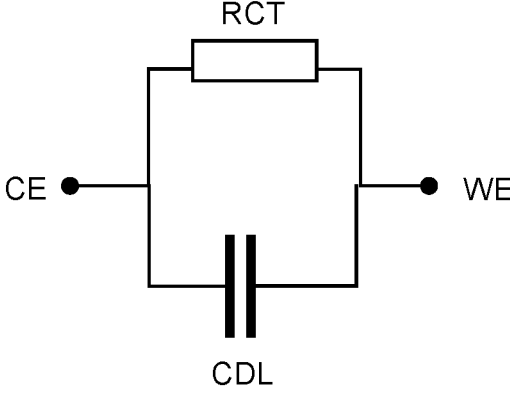
FIG. 10 is a circuit diagram of a Voigt equivalent circuit.

To better understand the behaviour of the normalised impedance $\Gamma$ value the cell 200 can be modelled for simplicity by a single Voight element, as shown in FIG. 10. The Voight element comprises a charge transfer impedance RCT in parallel with a double layer capacitance CDL. For this simplified model, the charge transfer impedance RCT and the double layer capacitance CDL may be modelled respectively by an electrode resistance Re in parallel with an electrode capacitance Ce given by the following equations:

$$R_e = \rho \frac{d}{A}$$

$$C_e = \epsilon_V \frac{A}{d}$$

Where A is the effective area of an electrode of the cell, d is the distance between the electrodes, $\rho$ is the resistivity of the electrolyte, and $\epsilon_V$ is the permittivity of the electrolyte. Where two electrodes are provided, the effective area of the electrode with the slowest time constant (TC) is considered in the above equations. From these equations we can derive the impedance of the Voigt cell as given by:

$$Z = \frac{d\rho}{A\left(1 + 4f^2\pi^2\epsilon_V^2\rho^2\right)} - i\frac{2df\pi\epsilon_V\rho^2}{A\left(1 + 4f^2\pi^2\epsilon_V^2\rho^2\right)}$$

Hence:

$$\Gamma = \frac{1}{1 + 2f\pi \; \epsilon_V\rho}$$

Notably, the impedance $\Gamma$ has no dependence on either A or d. As the cell 200 ages, the resistivity, permittivity, electrode area and electrode distance will change. The above impedance value will capture changes of interest, e.g. resistivity and permittivity, without being distorted by changes in electrode area A or spacing d.

The charge transfer impedance RCT is given by the Butler-Volmer relation, which can be simplified to:

$$R_{CT} = \frac{1}{n \; F_N \; i_0}$$

Where $F_N$ is the normalised Faraday constant and $i_0$ is given by:

$$i_0 = A \; F \; k_0 \; C_{OX}^{\alpha} \; C_{RED}^{1-\alpha}$$

Where F is the Faraday constant, $k_0$ is a scaling constant, $C_{OX}$ and $C_{RED}$ relate to concentrations in the electrolyte and $\alpha$ is a parameter relating to the age of cell.

The double layer capacitance CDL consists of two terms—the Stern capacitance CSTERN and the diffuse capacitance CDIFFUSE, as defined by the following:

$$C_{STERN} = \frac{\epsilon_R\epsilon_0 A}{d}$$

$$c_{DIFFUSE} = \frac{\epsilon_R \; \epsilon_0 \; A}{\lambda_D};$$

$$\lambda_D = \sqrt{\frac{\epsilon_R \; \epsilon_0 \; RT}{2 \; F^2 \; C_{OX}}};$$

The above leads to a more complex expression for the normalised impedance $\Gamma$ which is also insensitive to changes in electrode area A.

Having regard for the above, FIG. 11 is a flow diagram of a process 1100 which may be implemented by the device 500 for determining a state of health or other characteristic of the electrochemical cell 200 (or any other electrochemical cell). The system may be implemented by the device 500 in any conceivable manner, for example using one or more of the processor 502, the drive and measurement circuit 300, the temperature sensor 508 and the memory 504.

At step 1102, EIS may be performed on the cell 200 to obtain an impedance spectrum for the cell 200. EIS may be performed across a broad frequency spectrum, for example between 0.1 and 20 KHz. EIS may be performed once on the cell 200, for example during manufacture of the cell (in a characterisation phase) or during manufacture of the device 500. Alternatively, the impedance spectrum of the cell 200 may be modelled. Thus, the device 500 may not perform this step.

At step 1104, a frequency of interest is determined. This frequency of interest $\omega_1$ is determined based on the frequency at the RC crest of the Nyquist plot and the turning point frequency (referred to above).

At step 1106, the corresponding real and imaginary components of the impedance of interest of the cell 200, which is the impedance at the frequency of interest (calculated at step 1104), may be calculated.

At step 1108, the normalised impedance may be calculated from the real and imaginary components of the impedance of interest.

At step 1110, The normalised impedance may then be used to determine one or more characteristics of the cell 200.

It will be appreciated that normalised impedance (dimensionless parameter) may be used in a similar manner to that described above. For example, the normalised impedance may be calculated at different times during the transition of the device 500 from manufacture to deployment/activation such that a state of health of the cell 200 can be ascertained. For example, referring to FIG. 6, the normalised impedance may be derived from the first and/or second signals obtained from the cell at steps 604 and 612. Step 614 may then comprise determining a difference between the normalised and impedances derived at these steps to determine a change in characteristic of the cell 200 (e.g. a state of health of the cell 200).

The skilled person will recognise that some aspects of the above-described apparatus and methods may be embodied as processor control code, for example on a non-volatile carrier medium such as a disk, CD- or DVD-ROM, programmed memory such as read only memory (Firmware), or on a data carrier such as an optical or electrical signal carrier. For many applications embodiments of the invention will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re) programmable analogue array or similar device in order to configure analogue hardware.

Note that as used herein the term module shall be used to refer to a functional unit or block which may be implemented at least partly by dedicated hardware components such as custom defined circuitry and/or at least partly be implemented by one or more software processors or appropriate code running on a suitable general purpose processor or the like. A module may itself comprise other modules or functional units. A module may be provided by multiple components or sub-modules which need not be co-located and could be provided on different integrated circuits and/or running on different processors.

Embodiments may be implemented in a host device, especially a portable and/or battery powered host device such as a mobile computing device for example a laptop or tablet computer, a games console, a remote control device, a home automation controller or a domestic appliance including a domestic temperature or lighting control system, a toy, a machine such as a robot, an audio player, a video player, or a mobile telephone for example a smartphone.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

The invention claimed is:

1. Circuitry for monitoring a characteristic of a battery cell integrated into a wearable device, the circuitry configured to:

upon installation of the battery cell into the wearable device:

obtaining a first signal from the battery cell; and upon activation of the wearable device after installation of the battery cell:

obtain a second signal from the battery cell; and determine a characteristic of the battery cell based on the first signal and the second signal.

2. Circuitry of claim 1, wherein activation of the wearable device comprises powering up the wearable device.

3. Circuitry of claim 2, wherein the wearable device comprises a sensor for detecting removal of the wearable device from packaging, and wherein activation of the wearable device comprises removal of the wearable device from packaging.

4. Circuitry of claim 1, wherein the characteristic comprises one of the following:

a) a state of health;

b) a state of charge;

c) a power fade;

d) a capacity fade; and e) ageing.

5. Circuitry of claim 1, wherein the circuitry is configured to:

determine a difference between the first signal and the second signal; and determine the characteristic of the battery cell based on the difference.

6. Circuitry of claim 5, wherein the circuitry is configured to:

compare the difference to a difference threshold; and determine that the characteristic is outside of a standard operating condition of the cell if the difference is greater than a difference threshold.

7. Circuitry of claim 1, wherein the circuitry is configured to:

compare the first signal to a first criteria;

compare the second signal to a second criteria; and flag that the characteristic is outside of an operating range if the first signal fails to satisfy the first criteria or the second signal fails to satisfy the second criteria.

8. Circuitry of claim 7, wherein the second criteria is dependent on a time elapsed between the installation of the battery cell and the activation of the wearable device.

9. Circuitry of claim 1, comprising:

a non-volatile memory, wherein the first and second signals are stored in the non-volatile memory.

10. Circuitry of claim 9, further comprising:

a real time clock, wherein the first and second signal are stored in the non-volatile memory with a time stamp generated using the real time clock.

11. Circuitry of claim 1, wherein determining the characteristic comprises determining a fault associated with the battery cell.

12. Circuitry of claim 1, wherein obtaining the first signal from the battery cell comprises applying a first stimulus to the battery cell, wherein the first signal is responsive to the first stimulus, and wherein obtaining the second signal from the battery cell comprises applying a second stimulus to the battery cell, wherein the second signal is responsive to the second stimulus.

13. Circuitry of claim 12, wherein the first stimulus and/or the second stimulus comprises a step signal or an impulse signal.

14. Circuitry of claim 12, wherein the first stimulus and/or the second stimulus comprises a sine wave or a triangle wave or a chirp.

15. Circuitry of claim 14, wherein a frequency of the sine wave or the triangle wave is adjusted over a range of frequencies.

16. Circuitry of claim 1, wherein determining the characteristic of the battery cell based on the first signal and the second signal comprises:

determining, from the first signal, a first impedance of the battery cell at a first frequency;

determining, from the second signal, a second impedance of the battery cell at the first frequency.

17. Circuitry of claim 16, wherein:

the first impedance comprises a first real component and a first imaginary component;

the second impedance comprises a second real component and a second imaginary component; and determining the characteristic of the battery cell based on the first signal and the second signal comprises:

normalising the first impedance to obtain a first dimensionless parameter based on the first real component and the first imaginary component; and normalising the second impedance to obtain a second dimensionless parameter based on the second real component and the second imaginary component.

18. Circuitry of claim 17, wherein the first dimensionless parameter is defined by a ratio of the first real component or the first imaginary component to a sum or difference of the first real and imaginary components, and/or wherein the second dimensionless parameter is defined by a ratio of the second real component or the second imaginary component to a sum or difference of the second real and imaginary components.

19. Circuitry of claim 17, wherein the first dimensionless parameter and the second dimensionless parameter are substantially independent of an area of an electrode of the battery cell or a distance between two or more electrodes of the battery cell.

20. Circuitry of claim 17, wherein determining the characteristic of the battery cell comprises comparing the first dimensionless parameter to the second dimensionless parameter.

21. Circuitry of claim 17, wherein the first frequency is selected to minimise a dependence of the first and second impedances on temperature.

22. Circuitry of claim 16, further configured to:

prior to obtaining the first signal:

apply a broadband stimulus to the battery cell;

measure a broadband response of the battery cell to the broadband stimulus over a frequency range; and determine the first frequency based on the measured broadband response.

23. Circuitry of claim 22, wherein the broadband stimulus has a frequency range spanning between approximately 0.1 Hz and 1 MHz.

24. Circuitry of claim 1, further comprising a temperature sensor configured to monitor a temperature at the wearable device between the installation and the activation, wherein the circuitry is configured to output a temperature flag if the temperature falls outside of a safe operating range.

25. Circuitry of claim 1, wherein the circuitry comprises a real time clock.

26. Circuitry of claim 25, wherein the real time clock is configured to track a time between the installation and the activation.

27. Circuitry of claim 25, wherein the circuitry is configured to output a time flag if the time between the installation and the activation exceeds a predetermined duration.

28. An integrated circuit (IC), comprising the circuitry of claim 1.

29. A wearable device, comprising:
circuitry of claim 1; and
the battery cell.

30. The wearable device of claim 29, wherein the wearable device comprises one of an analyte monitor, a glucose monitor, a battery monitor, a mobile computing device, a smart watch, a remote control device, a home automation controller, an audio player, a video player, a mobile telephone, and a smartphone.

31. Circuitry for determining a state of health of an battery cell integrated into a wearable device, the circuitry configured to:
apply a first stimulus to the battery cell;
measure a first response of the battery cell to the first stimulus at a first frequency;
determine, from the first response, a first impedance of the battery cell at a first frequency, the first impedance comprising a first real component and a first imaginary component; and
normalise the first impedance to obtain a first dimensionless parameter based on the first real component and the first imaginary component; and determine the state of health based on the first dimensionless parameter.

32. Circuitry of claim 31, wherein the circuitry is further configured to:
apply a second stimulus to the battery cell after application of the first stimulus;
measure a second response of the battery cell to the second stimulus at the first frequency;
determine, from the second response, a second impedance of the battery cell at a first frequency, the first impedance comprising a second real component and a second imaginary component;
normalise the second impedance to obtain a second dimensionless parameter based on the second real component and the second imaginary component; and
determine the state of health based on the second dimensionless parameter.

33. Circuitry of claim 31, wherein determining the state of health comprises:
comparing the first dimensionless parameter to the second dimensionless parameter.

34. Circuitry of claim 31, wherein the first stimulus is applied to the battery cell upon installation of the battery cell into the wearable device, and wherein the second stimulus is applied to the battery cell upon first activation of the wearable device after integration of the battery cell.

* * * * *